United States Patent
Ghosh et al.

(10) Patent No.: US 12,100,660 B2
(45) Date of Patent: Sep. 24, 2024

(54) LOW CONGESTION STANDARD CELLS

(71) Applicant: Advanced Micro Devices, Inc., Santa Clara, CA (US)

(72) Inventors: Partha Pratim Ghosh, Santa Clara, CA (US); Pratap Kumar Das, Bangalore (IN); Prasanth M, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 435 days.

(21) Appl. No.: 17/493,559

(22) Filed: Oct. 4, 2021

(65) Prior Publication Data

US 2023/0106921 A1 Apr. 6, 2023

(51) Int. Cl.
*H01L 23/528* (2006.01)
*H01L 21/768* (2006.01)

(52) U.S. Cl.
CPC .... *H01L 23/5286* (2013.01); *H01L 21/76895* (2013.01)

(58) Field of Classification Search
CPC ........... H01L 23/5286; H01L 21/76895; H01L 27/0207
See application file for complete search history.

(56) References Cited

U.S. PATENT DOCUMENTS

| | | | |
|---|---|---|---|
| 10,593,604 B1* | 3/2020 | Lam | H01L 22/12 |
| 10,978,438 B1* | 4/2021 | Lam | H01L 29/41775 |
| 2013/0126978 A1* | 5/2013 | Becker | H01L 27/092 257/369 |
| 2017/0083654 A1* | 3/2017 | Chuang | G06F 30/398 |
| 2017/0294430 A1* | 10/2017 | Seo | H01L 23/528 |
| 2018/0150589 A1* | 5/2018 | Yang | H01L 27/11807 |
| 2018/0183414 A1* | 6/2018 | Guo | H03K 23/58 |
| 2019/0198491 A1* | 6/2019 | Do | H01L 21/823871 |
| 2019/0304900 A1* | 10/2019 | Chen | G06F 30/39 |
| 2022/0181318 A1* | 6/2022 | Liebmann | H01L 21/8221 |
| 2022/0262786 A1* | 8/2022 | Yu | H01L 27/0207 |
| 2022/0367439 A1* | 11/2022 | Kang | H01L 27/0207 |
| 2023/0040733 A1* | 2/2023 | Yu | H01L 27/0886 |
| 2023/0060387 A1* | 3/2023 | Wang | G06F 30/392 |
| 2023/0092184 A1* | 3/2023 | Schultz | G06F 30/394 257/773 |
| 2023/0096645 A1* | 3/2023 | Chen | H01L 27/0207 257/390 |

* cited by examiner

*Primary Examiner* — Nha T Nguyen
(74) *Attorney, Agent, or Firm* — Kowert, Hood, Munyon, Rankin & Goetzel, P.C.; Rory D. Rankin (57) ABSTRACT

A system and method for creating layout for standard cells are described. In various implementations, a semiconductor fabrication process (or process) forms a power signal route in a same metal zero track reserved for power rails. The process forms a contact layer with inserted spacing underneath the power signal route. Along the track, this contact layer has physical contact with the power signal route with a first distance greater than a width of any signal route in any metal layer orthogonal to the power signal route, and has no physical contact with the power signal route with a second distance greater than the width. One or more signal routes in the local interconnect layer are routed through this spacing. Without this spacing, signals would be routed through this area using the metal one layer, which increases signal congestion.

20 Claims, 7 Drawing Sheets

LOW CONGESTION STANDARD CELLS

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that may limit potential benefits. For example, as the number and size of signal routes used in a design increase, the area consumed by the corresponding metal wires also increases. Therefore, signal congestion occurs. Further, to meet desired high performance, transistor sizes are increased to improve drive strength and reduce response times of the transistor. However, the increased transistor sizes in addition to the signal congestion causes standard cells to expand. The expanded standard cells, which are instantiated multiple times and possibly thousands of times on the semiconductor die, increase the on-die area of the chip.

In view of the above, efficient methods and systems for creating layout of standard cells are desired.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently creating layout of standard cells are contemplated. In various implementations, a semiconductor fabrication process (or process) forms a power signal route in a track reserved for power rails. In some implementations, the power signal route is formed as a unidirectional signal route in a metal zero layer. In various implementations, the metal zero layer is a lowest metal layer above the gate region of a transistor. The process forms a unidirectional contact layer below the power signal route. This contact layer has physical contact with the power signal route along the track with a first distance greater than a width of any signal route in any metal layer orthogonal to the power signal route. This contact layer also has no physical contact with the power signal route along the track with a second distance greater than the width. Therefore, the contact layer is formed underneath the power signal route with a spacing inserted in it. It is understood that the semiconductor fabrication process actually forms the contact layer with the inserted spacing prior to forming the power signal route of the metal zero layer. One or more signal routes in the local interconnect layer are routed through the area of this spacing of the contact layer. Without this spacing, signals would be routed through this area using the metal one layer, which increases signal congestion. However, by using the local interconnect layer, less tracks of the metal one layer are used, which reduces signal congestion for the standard cell.

Figure 1:
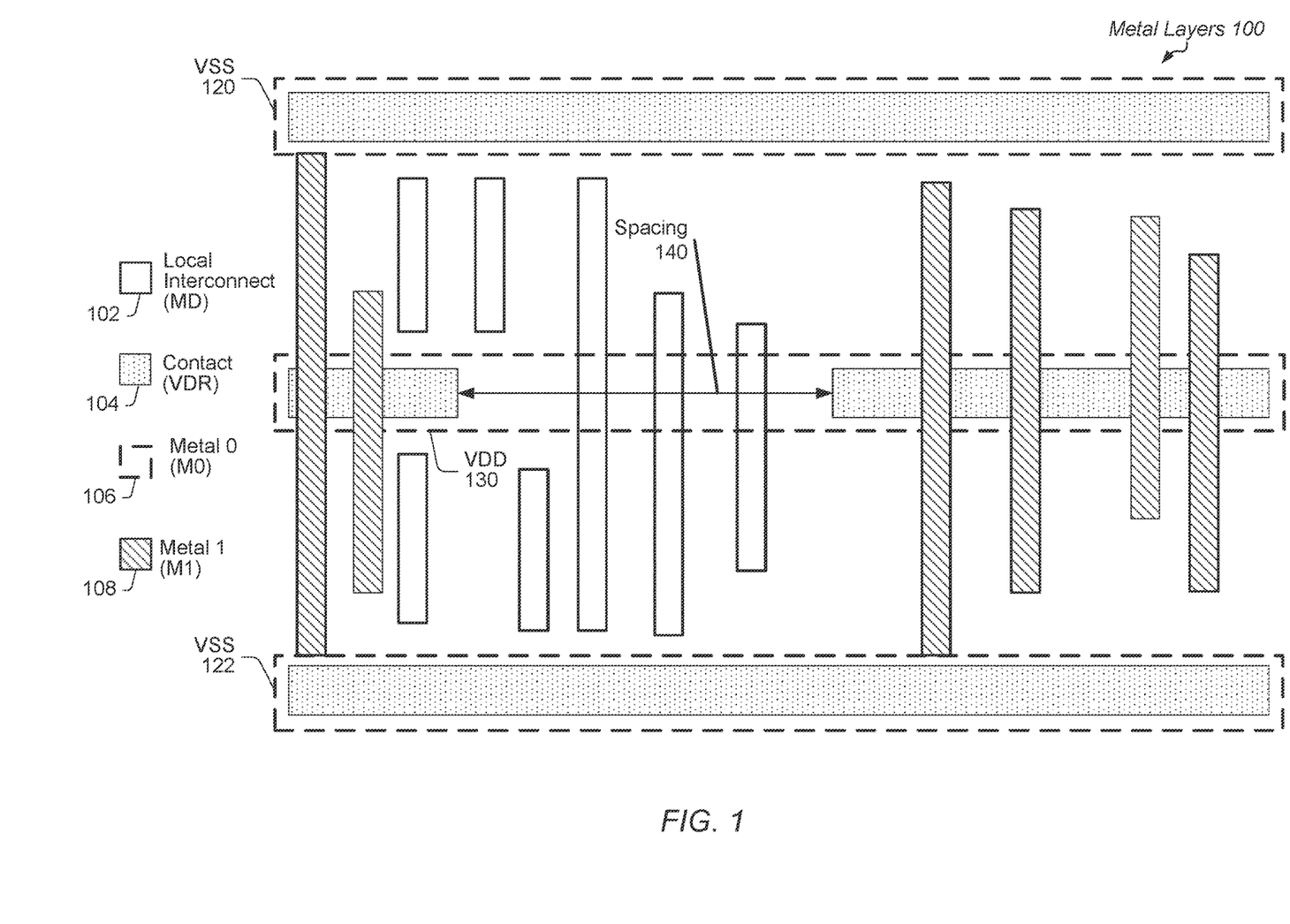
FIG. 1 is a generalized diagram of a top view of metal layers of a standard cell layout utilizing spacing between a contact layer of a same track reserved for power rails.

Turning now to FIG. 1, a generalized block diagram is shown of a top view of metal layers 100 of a standard cell layout utilizing spacing between a contact layer of a same track reserved for power rails. The metal layers 100 of the standard cell layout is for a flip-flop circuit, but in other implementations, the characteristics and techniques used for the metal layers 100 of the standard cell layout is used for a variety of other types of Boolean gates and complex gates. The local interconnect (MD) layer 102, the contact (VDR) layer 104, the metal zero (M0) layer 106, and the metal one (M1) layer 108 are shown. Other layers and materials are not shown in the illustration such as the active regions, the metal gate layer, the source and drain regions, other metal layers, other vias (or contacts), and so forth. In various implementations, the metal zero layer 106 is a lowest metal layer above the gate region of a transistor. As shown, the standard cell uses multiple power signal routes of a same reference voltage level. For example, the standard cell uses metal zero layer 106 for providing VDD 130. Similarly, the standard cell uses metal zero layer 106 for providing both VSS 120 and VSS 122, which have a same ground reference voltage level.

The p-type metal oxide semiconductor (PMOS) field effect transistors FETS (or pfets) are formed in the middle of the metal layers 100 of the standard cell layout both above and below the metal zero layer 106 that provides VDD 130. The active region (not shown) used for creating p-type transistors is a silicon substrate doped with Boron or Gallium during a semiconductor fabrication process. The n-type metal oxide semiconductor (NMOS) FETS (or nfets) are formed both at the top and the bottom of the standard cell layout 100 near the metal zero layers 106 that provide VSS 120 and VSS 122. The active region (not shown) used for creating n-type transistors is a silicon substrate doped with Phosphorous or Arsenic during a semiconductor fabrication process. In some implementations, the transistors are planar transistors, whereas, in other implementations, the transistors are non-planar transistors. An example of a non-planar transistor is a Fin FET. As used herein, a "transistor" is also referred to as a "semiconductor device" or a "device."

The metal layers 100 of the standard cell uses the power signal route VDD 130 in a metal zero track reserved for a power rail. The metal layers 100 of the standard cell also uses the power signal routes VSS 120 and VSS 122 in separate metal zero tracks reserved for power rails. The standard cell uses a dual height layout where the top-most and bottom-most metal zero tracks provide the ground reference voltage level with VSS 120 and VSS 122. The standard cell uses a single metal zero track in the middle of the cell to provide the power supply reference voltage level with VDD 130. As described above, transistors (not shown) are formed both above and below the metal zero track that includes VDD 130. Although the assignment of the power signals is shown with VDD 130 in the middle of the standard cell and VSS 120 and VSS 122 at the top and bottom of the standard cell, in other implementations, the ground reference voltage level is routed in the middle of the standard cell with the power supply reference voltage level being routed at the top and bottom of the standard cell. At least the metal tracks reserved for power rails are unidirectional tracks. Signal routes (and metal tracks) with no bends and no L-shapes are referred to as unidirectional routes (and unidirectional tracks). In contrast, signal routes with bends and/or L-shapes are referred to as bidirectional routes. Bidirectional routes create a significant on-die area penalty. As shown, the signals of the metal layers 100 are formed as unidirectional signal routes.

The metal layers 100 include the contact (VDR) layer 104 below and physically connected to the power signal routes VSS 120, VSS 122, and VDD 130. The use of the contact layer 104 eliminates the use of separate via placement to make a physical connection to the power signal routes 120-130. In some implementations, the contact layer 104 has the same width and length dimensions as the power signal route formed above it in the metal zero layer 106. In other implementations, a spacing exists between the edges of a particular contact layer 104 and a corresponding one of the power signal routes 120-130 formed above it in the metal zero layer 106. This spacing is shown in the metal layers 100. This spacing is different than the spacing 140 shown in the metal layers 100. In contrast, the spacing 140 is between the edges of two routes of the contact layer 104 in a same track as VDD 130.

In various implementations, a distance of the spacing between the edges of a particular contact layer 104 and a corresponding one of the power signal routes 120-130 formed above it in the metal zero layer 106 is less than a width of any signal route in any metal layer orthogonal to the power signal route. For example, the distance of this spacing is less than a width of a vertical signal route in the local interconnect (MD) layer 102. In contrast, in various implementations, a distance of the spacing 140 along the unidirectional metal zero track reserved for power rails is greater than a width of a signal route of the local interconnect layer 102. As shown, multiple signal routes in the local interconnect layer 102 are routed through the area of the spacing 140. Without the separation of the contact layer 104 physically connected to VDD 130, the signal routes through the spacing 140 would need to utilize the metal one layer 108. However, by using the local interconnect layer 102, less tracks of the metal one layer are used, which reduces signal congestion for the standard cell.

Figure 2:
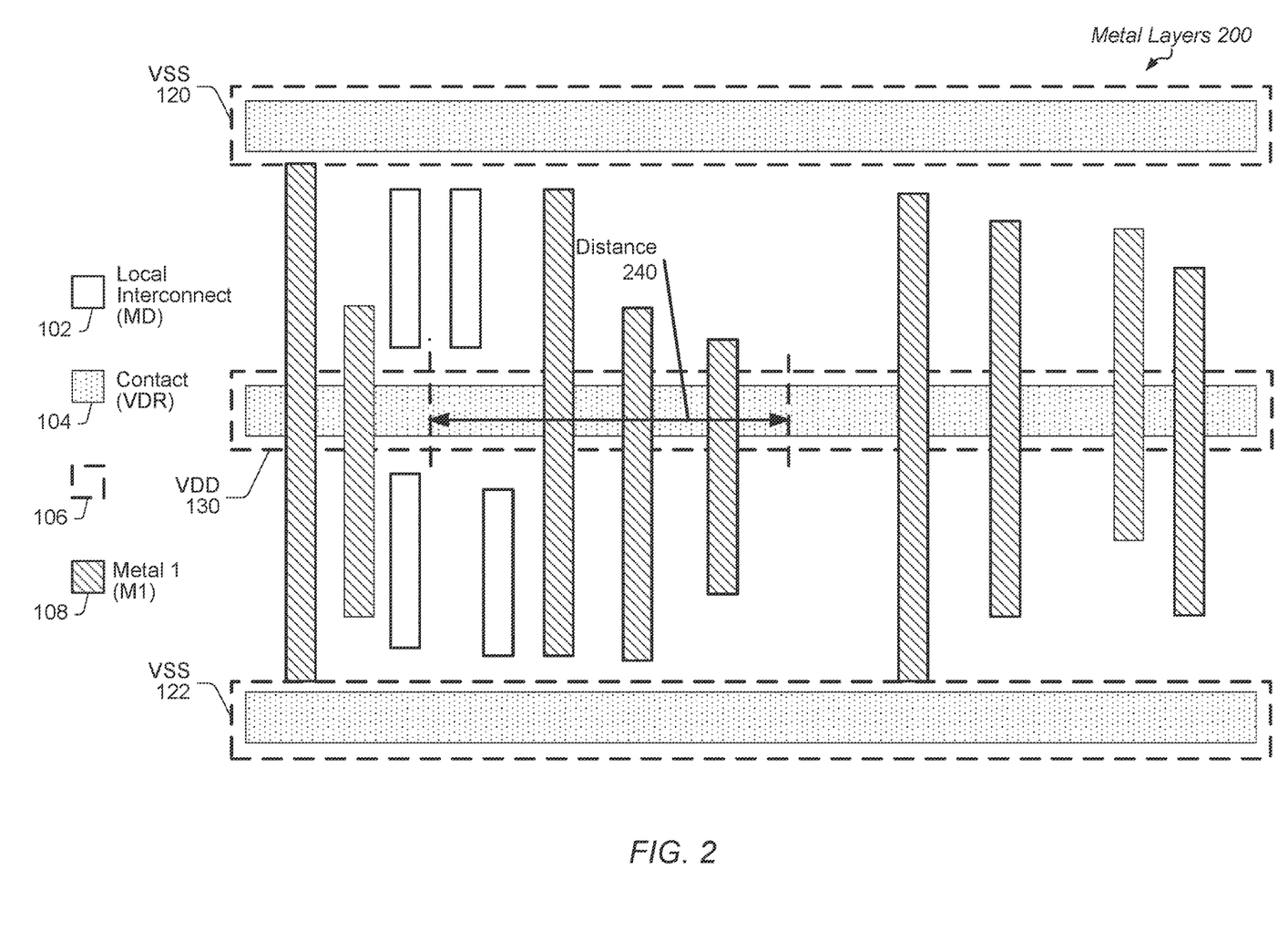
FIG. 2 is a generalized diagram of a top view of metal layers of a standard cell layout without utilizing spacing between a contact layer of a same track reserved for power rails.

Referring to FIG. 2, a generalized block diagram is shown of a top view of metal layers 200 of a standard cell layout utilizing no spacing between a contact layer of a same track reserved for power rails. Layout elements and materials described earlier are numbered identically. As shown, the metal layers 200 does not use a spacing in the contact layer 104 below the metal zero layer used for routing VDD 130. Therefore, there is no spacing 140 as used by the metal layers 100 (of FIG. 1). The distance 240 is the same distance as the spacing 140, but here, signal routes of the local interconnect layer 102 are routed up to the metal one layer 108 in order to traverse through the standard cell. Otherwise, the signal routes would create a physical connection with the contact layer 104 underneath VDD 130, which would create an electrical connection (or electrical short). Consequently, the use of the metal one layer 108 for these signal routes increases signal congestion for the standard cell.

Figure 3:
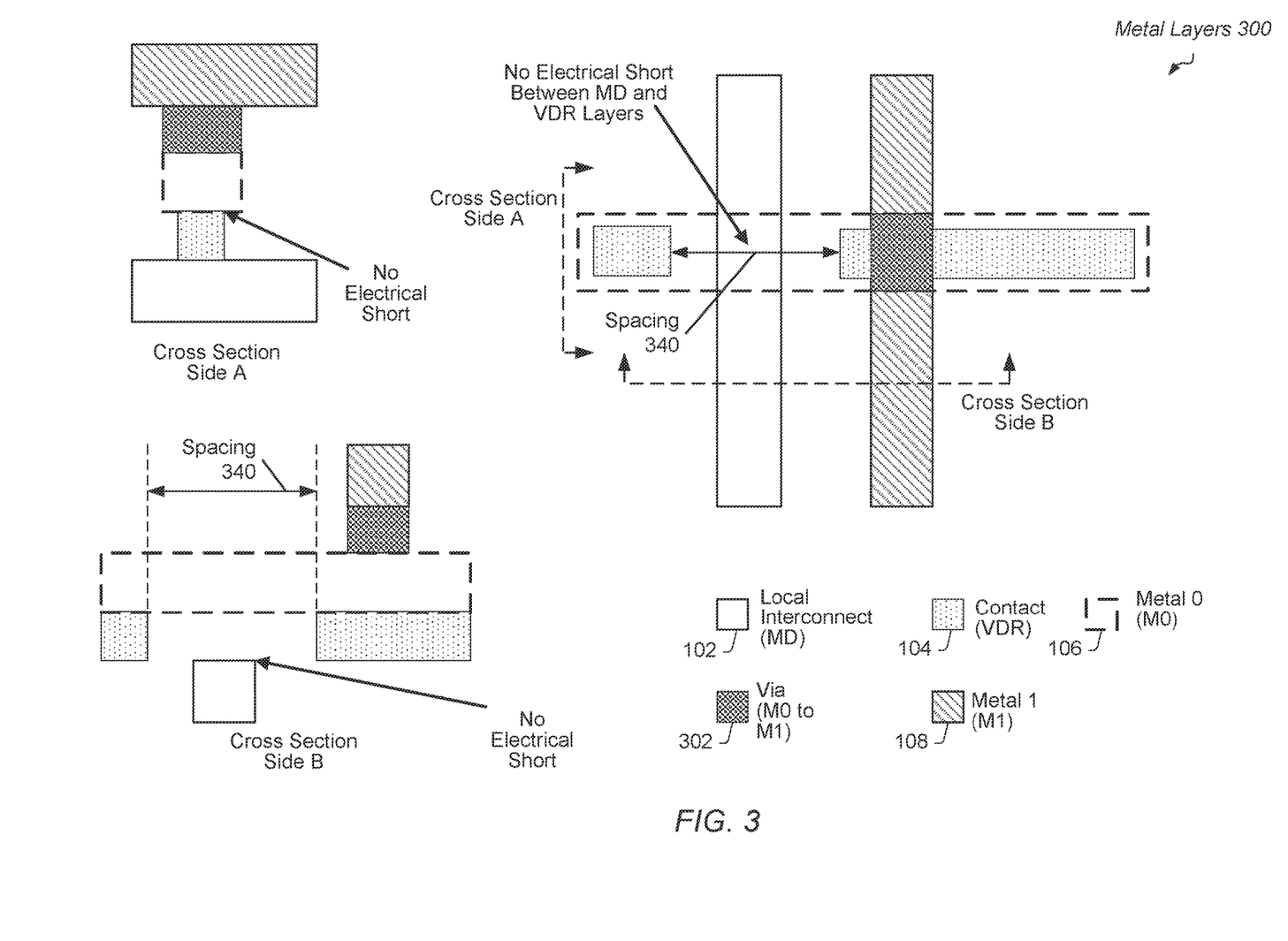
FIG. 3 is a generalized diagram of multiple views of metal layers of a standard cell layout utilizing spacing between a contact layer of a same track reserved for power rails.

Turning now to FIG. 3, a generalized block diagram is shown of metal layers 300 of a standard cell layout utilizing spacing a and contact layer of a same track reserved for power rails. Layout elements and materials described earlier are numbered identically. The cross sections of the side A and the side B are also provided to aid viewing the layout in three dimensions. The top view of the metal layers 300 and the cross section of side B easily illustrate the lack of a physical connection between the local interconnect layer 102 and the contact layer 104 where spacing 340 is used in a track reserved for power rails. The contact layers 104 on each side of the spacing 340 provide a same reference voltage level of one or more power supply reference voltage levels and ground reference voltage levels as the metal zero layer 106. Since the contact layer 104 is discontinued across the spacing 340, it is possible to route multiple signals in the local interconnect layer 102 in the spacing 340 without creating electrical connections between the layers 102 and 104. Additionally, it is unnecessary to use the metal one layer 108 to route signals through the spacing 340, which reduces signal congestion in the standard cell. In contrast, signal routes that traverse past the power rail outside of the spacing 340 utilize the via 302 and the metal one layer 108.

Figure 4:
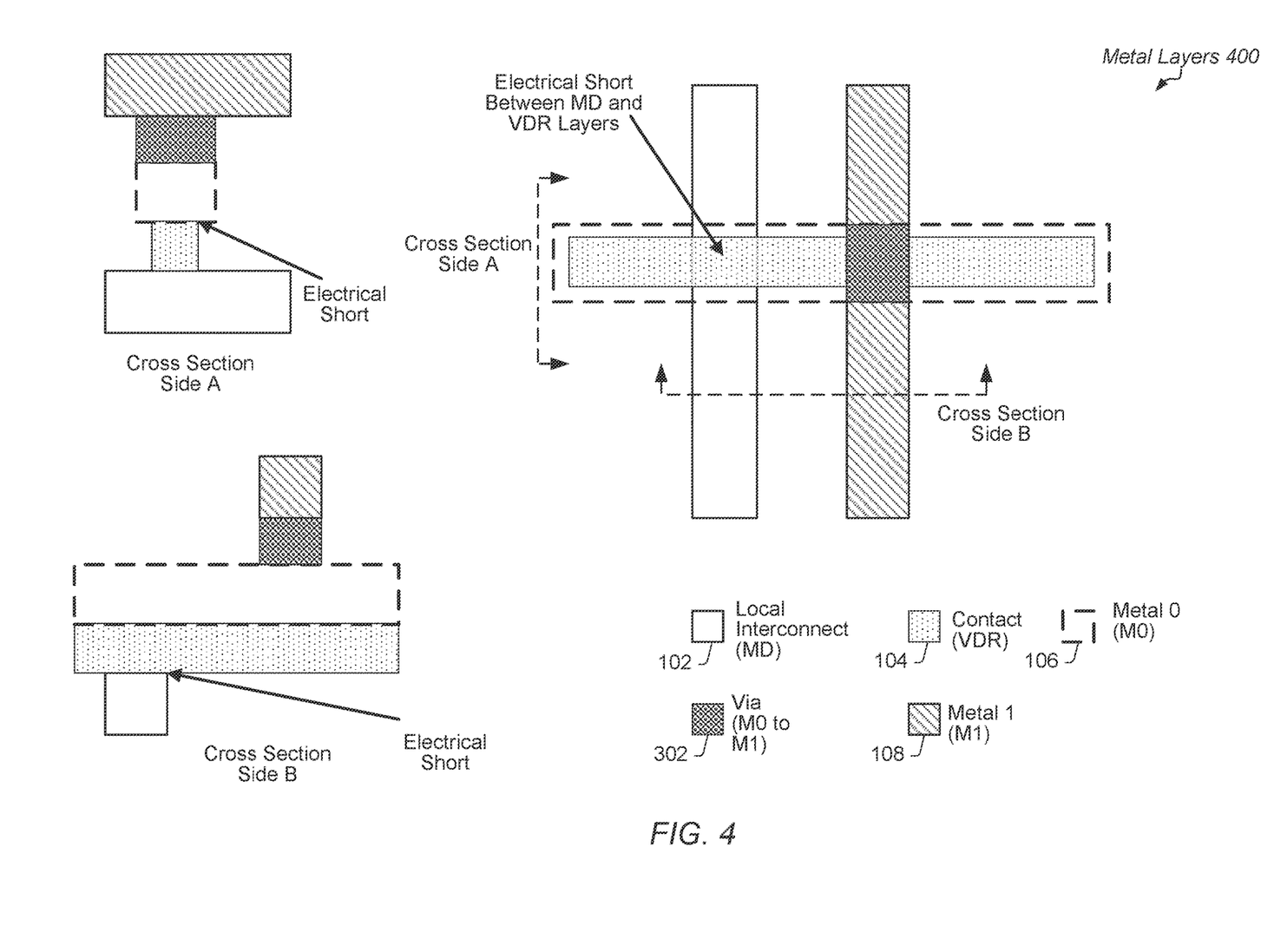
FIG. 4 is a generalized diagram of multiple views of metal layers of a standard cell layout without utilizing spacing between a contact layer of a same track reserved for power rails.

Referring to FIG. 4, a generalized block diagram is shown of metal layers 400 of a standard cell layout utilizing spacing between a contact layer of a same track reserved for power rails. Layout elements and materials described earlier are numbered identically. The cross sections of the side A and the side B are also provided to aid viewing the layout in three dimensions. The contact layer 104 and the metal zero layer 106 provide a same reference voltage level of one or more power supply reference voltage levels and ground reference voltage levels. The top view of the metal layers 400 and the cross section of side B easily illustrate a physical connection between the local interconnect layer 102 and the contact layer 104. Since the contact layer 104 is continued with no spacing, it is not possible to route multiple signals in the local interconnect layer 102 underneath the metal zero layer 106 without creating physical connections, and resulting electrical connections (electrical shorts), between the layers 102 and 104. Therefore, it is necessary to use the metal one layer 108 to route signals that traverse the metal zero layer 106 underneath the metal zero layer 106, and avoid the physical connections illustrated in the metal layers 400. However, the use of the metal one layer 108 to avoid the physical connections and resulting electrical shorts also increases signal congestion.

Figure 5:
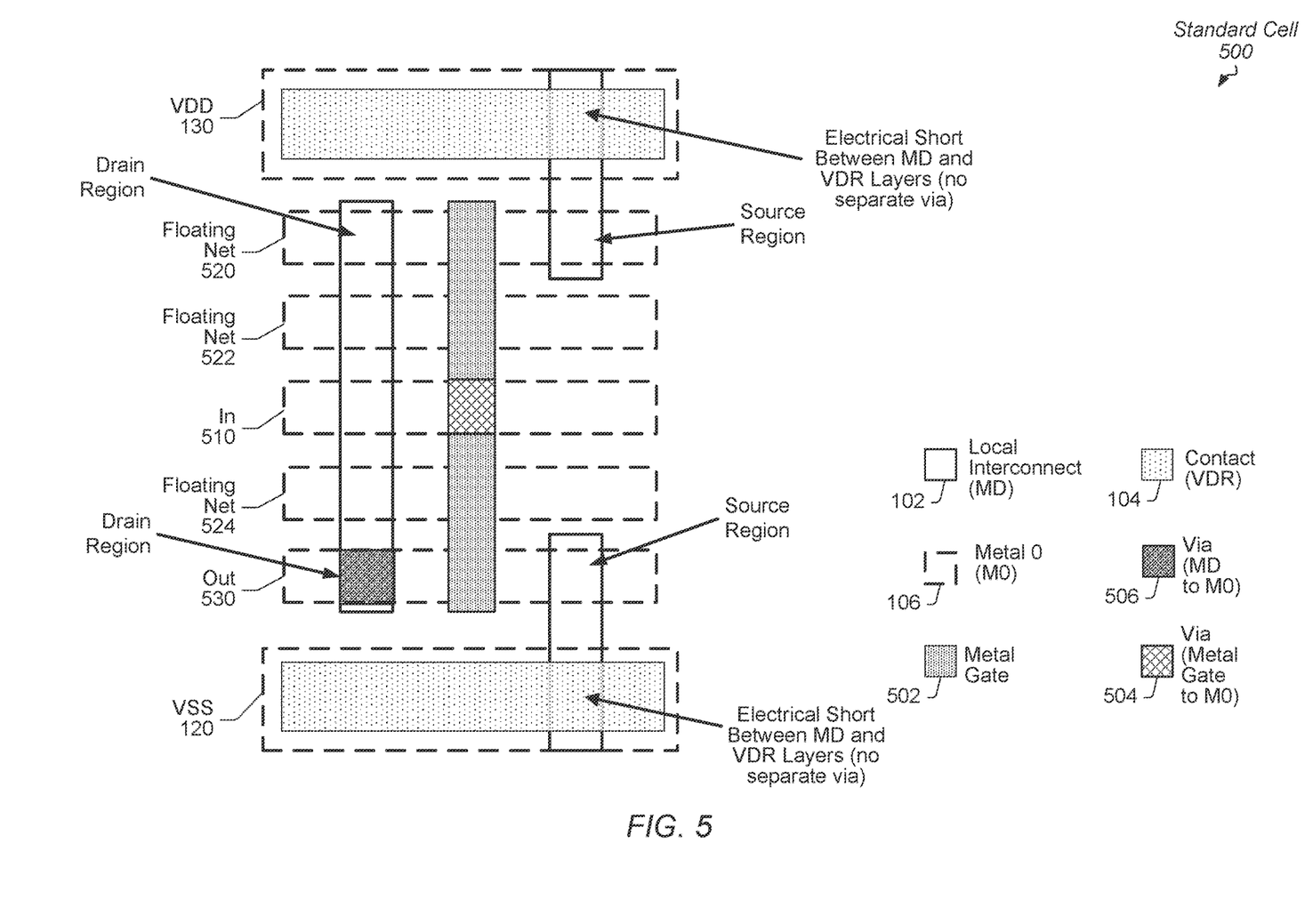
FIG. 5 is a generalized diagram of a top view of metal layers of a standard cell.

Turning now to FIG. 5, a generalized block diagram is shown of a top view of metal layers 500 of a standard cell layout. Layout elements and materials described earlier are numbered identically. The metal layers 500 of the standard cell layout is for an inverter. A PMOS FET is located at the top of the metal layers 500 of the standard cell layout, and an NMOS FET is located at the bottom of the metal layers 500. The local interconnect (MD) layer 102, the contact (VDR) layer 104, the metal zero (M0) layer 106, the metal gate layer 502, and the vias 504 and 506 are shown. Other layers and materials are not shown in the illustration such as the active regions, the formed source and drain regions, other metal layers, other vias (or contacts), and so forth. Here, the standard cell uses the contact layer 104 underneath the power rails VDD 130 and VSS 120 routed in the metal zero layer 106. The inverter does not utilize a discontinuation (or spacing) in the routing of the contact layer 104 and the metal zero layer 106.

The source and drain regions of both transistors are pointed out, although the actual formations are underneath the layers shown. In some implementations, the standard cell 500 of the inverter uses the floating metal nets 520, 522 and 524 in the metal zero layer 106 to provide structural strength. The metal gate 502 and the via 504 provide the received input signal In 510 to both the transistors of the inverter. The output node, Out 530 is provided on the metal zero track at the bottom of the layout. The contact layer 104 is used to physically connect the power rails VDD 130 and VSS 120 to the local interconnect layer 102 that is routed to respective source regions. Therefore, a separate via is unnecessary. Therefore, at times, physical connections between the layers 102 and 104 are purposely used to connect nodes of a circuit. However, as the power rails VDD 130 and VSS 120 continue to be routed across the die to other cells, spacings are placed both between cells and within cells to aid signal congestion. For example, a spacing such as the spacing 140 is used in the integrated circuit.

Figure 6:
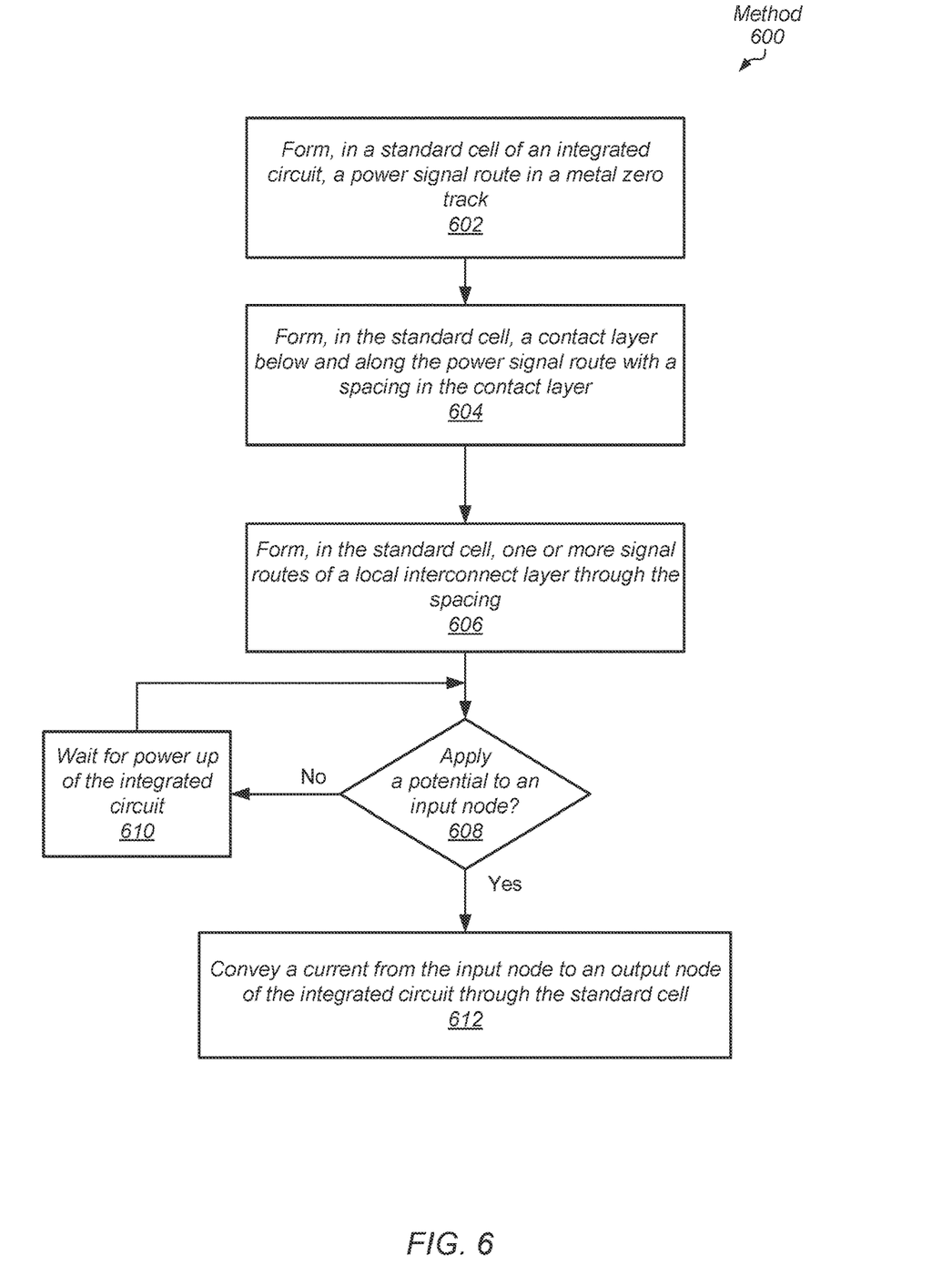
FIG. 6 is a generalized diagram of one embodiment of a method for creating metal layers of a standard cell layout utilizing spacing between a contact layer of a same track reserved for power rails.

Referring now to FIG. 6, one embodiment of a method 600 is shown for creating metal layers of a standard cell layout utilizing cut metal and contact layers. For purposes of discussion, the steps in this embodiment are shown in sequential order. However, in other embodiments some steps occur in a different order than shown, some steps are performed concurrently, some steps are combined with other steps, and some steps are absent.

A semiconductor fabrication process forms, in a standard cell of an integrated circuit, a power signal route in a metal zero track (block 602). The power signal route VDD 130 (of FIG. 1) is an example of such a signal route. In some implementations, the power signal route is a unidirectional signal route. Signal routes with no bends and no L-shapes are referred to as unidirectional routes. In contrast, signal routes with bends and/or L-shapes are referred to as bidirectional routes. Bidirectional routes create a significant on-die area penalty. In various implementations, the process forms the power signal routes and signals in the local interconnect layer as unidirectional signal routes. The semiconductor fabrication process (or process) forms, in the standard cell, a contact layer below and along the power signal route with a spacing in the contact layer (block 604). The contact (VDR) layer 104 (of FIG. 1) is an example of such a contact layer. In some implementations, this contact layer is also a unidirectional layer.

In an implementation, a distance of the spacing along the track of the contact layer is greater than a width of any signal route of the local interconnect layer. Similarly, a distance along the track of the contact layer where the contact layer makes physical contact with the power signal route is greater than this width. The process forms, in the standard cell, one or more signal routes of the local interconnect layer through the spacing (block 606).

If a potential is not applied to an input node of the standard cell ("no" branch of the conditional block 608), then the standard cell waits for power up (block 610). However, if a potential is applied to the input node of the standard cell ("yes" branch of the conditional block 608), then the circuitry of the standard cell conveys a current from the input node to an output node of the standard cell utilizing spacing between a contact layer of a same track reserved for power rails (block 612).

Figure 7:
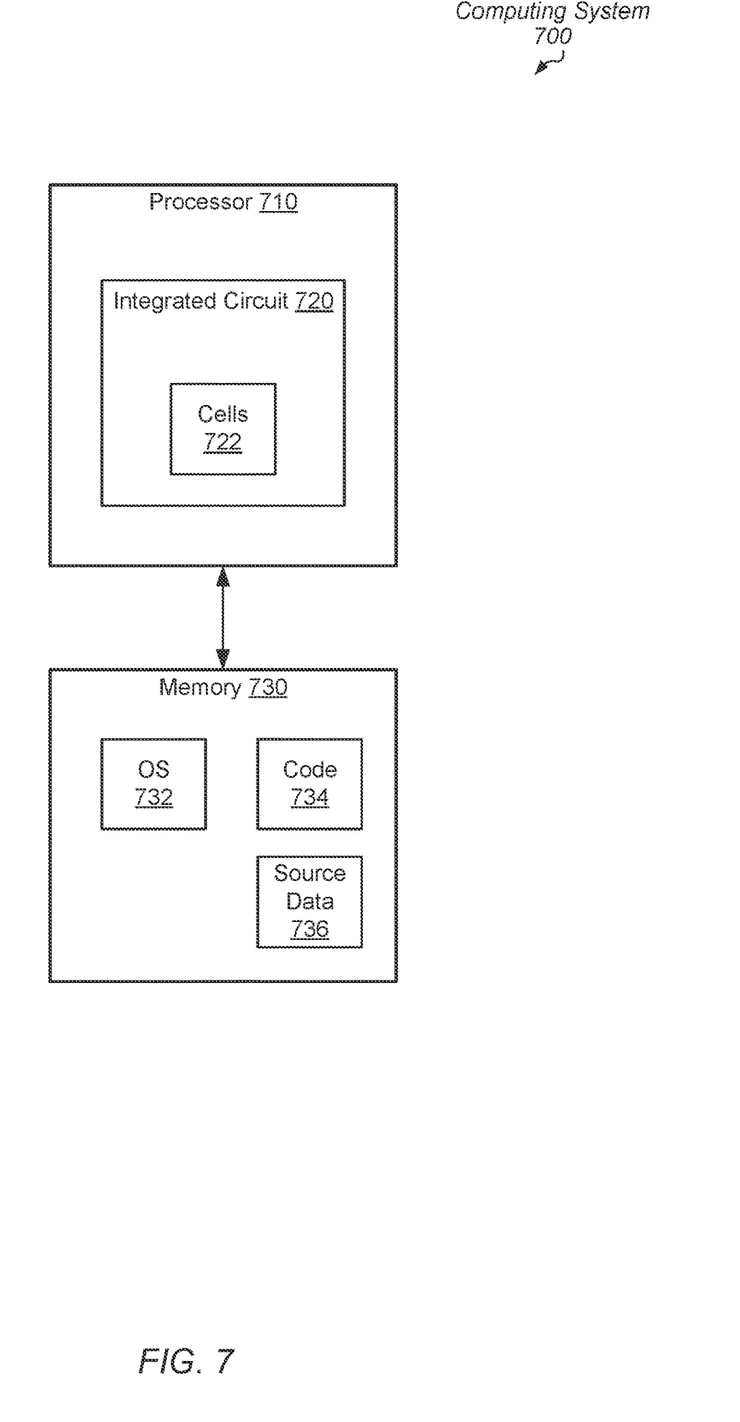
FIG. 7 is a generalized diagram of a top view of a computing system using standard cells with spacing between a contact layer of a same track reserved for power rails.

Referring to FIG. 7, one embodiment of a computing system 700 is shown. The computing system 700 includes the processor 710 and the memory 730. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 700 includes one or more of other processors of a same type or a different type than processor 710, one or more peripheral devices, a network interface, one or more other memory devices, and so forth. In some implementations, the functionality of the computing system 700 is incorporated on a system on chip (SoC). In other implementations, the functionality of the computing system 700 is incorporated on a peripheral card inserted in a motherboard. The computing system 700 is used in any of a variety of computing devices such as a desktop computer, a tablet computer, a laptop, a smartphone, a smartwatch, a gaming console, a personal assistant device, and so forth.

The processor 710 includes hardware such as circuitry. For example, the processor 710 includes at least one integrated circuit 720, which utilizes standard cells 722. One or more of the standard cells 722 utilize spacing between a contact layer of a same track reserved for power rails. For example, one or more standard cells 722 instantiated in the integrated circuit 720 use power connections as shown earlier for metal layers 100 (of FIG. 1) and metal layers 300 (of FIG. 3).

In various implementations, the processor 710 includes one or more processing units. In some implementations, each of the processing units includes one or more processor cores capable of general-purpose data processing, and an associated cache memory subsystem. In such an implementation, the processor 710 is a central processing unit (CPU). In another implementation, the processing cores are compute units, each with a highly parallel data microarchitecture with multiple parallel execution lanes and an associated data storage buffer. In such an implementation, the processor 710 is a graphics processing unit (GPU), a digital signal processor (DSP), or other.

In some implementations, the memory 730 includes one or more of a hard disk drive, a solid-state disk, other types of flash memory, a portable solid-state drive, a tape drive and so on. The memory 730 stores an operating system (OS) 732, one or more applications represented by code 734, and at least source data 736. Memory 730 is also capable of storing intermediate result data and final result data generated by the processor 710 when executing a particular application of code 734. Although a single operating system 732 and a single instance of code 734 and source data 736 are shown, in other implementations, another number of these software components are stored in memory 730. The operating system 732 includes instructions for initiating the boot up of the processor 710, assigning tasks to hardware circuitry, managing resources of the computing system 700 and hosting one or more virtual environments.

Each of the processor 710 and the memory 730 includes an interface unit for communicating with one another as well as any other hardware components included in the computing system 700. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage.

Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
  a unidirectional first signal route of a first metal layer that is a lowest metal layer above a gate region;
  a unidirectional first contact layer below the first signal route that:
    has physical contact with the first signal route along a unidirectional first track of the first metal layer with a first distance greater than a width of any signal route in any metal layer orthogonal to the first signal route; and
    has no physical contact with the first signal route along the unidirectional first track with a second distance greater than said width;
  wherein responsive to a potential being applied to an input node of the integrated circuit, a current is conveyed from the input node to an output node of the integrated circuit through the first contact layer.

2. The integrated circuit as recited in claim 1, wherein the first signal route reaches two boundaries of a standard cell.

3. The integrated circuit as recited in claim 1, wherein the first signal route provides one of a power supply voltage reference level and a ground reference voltage level used by the integrated circuit.

4. The integrated circuit as recited in claim 3, further comprising:
  a unidirectional second signal route of the first metal layer in a unidirectional second track of the first metal layer different than the unidirectional first track of the first metal layer, wherein the second signal route reaches two boundaries of a standard cell; and
  a unidirectional second contact layer below and physically connected to the second signal route along the unidirectional second track, wherein the second contact layer reaches two boundaries of the standard cell.

5. The integrated circuit as recited in claim 1, wherein the first distance is greater than a width of a plurality of signal routes of a local interconnect layer below and orthogonal to the first metal layer.

6. The integrated circuit as recited in claim 5, wherein one or more of the plurality of signal routes of the local interconnect layer provide one of an input node and an output node of a standard cell.

7. The integrated circuit as recited in claim 5, wherein the second distance is greater than a width of a plurality of signal routes of a local interconnect layer below and orthogonal to the first metal layer.

8. A method comprising:
  forming, in an integrated circuit, a unidirectional first signal route of a first metal layer that is a lowest metal layer above a gate region;
  forming, in the integrated circuit, a unidirectional first contact layer below the first signal route that:
    has physical contact with the first signal route along a unidirectional first track of the first metal layer with a first distance greater than a width of any signal route in any metal layer orthogonal to the first signal route; and
    has no physical contact with the first signal route along the unidirectional first track with a second distance greater than said width;
  responsive to a potential being applied to an input node of the integrated circuit, a current is conveyed from the input node to an output node of the integrated circuit through the first contact layer.

9. The method as recited in claim 8, wherein the first signal route reaches two boundaries of a standard cell.

10. The method as recited in claim 9, further comprising providing, by the first signal route, one of a power supply voltage reference level and a ground reference voltage level used by the integrated circuit.

11. The method as recited in claim 10, further comprising forming:
a unidirectional second signal route of the first metal layer in a unidirectional second track of the first metal layer different than the unidirectional first track of the first metal layer, wherein the second signal route reaches two boundaries of a standard cell; and
a unidirectional second contact layer below and physically connected to the second signal route along the unidirectional second track, wherein the second contact layer reaches two boundaries of the standard cell.

12. The method as recited in claim 8, wherein the first distance is greater than a width of a plurality of signal routes of a local interconnect layer below and orthogonal to the first metal layer.

13. The method as recited in claim 12, further comprising providing, by one or more of the plurality of signal routes of the local interconnect layer, one of an input node and an output node of a standard cell.

14. The method as recited in claim 12, wherein the second distance is greater than a width of a plurality of signal routes of a local interconnect layer below and orthogonal to the first metal layer.

15. A computing system comprising:
a memory configured to store instructions of one or more tasks and source data to be processed by the one or more tasks;
an integrated circuit configured to execute the instructions using the source data, wherein the integrated circuit comprises:
a unidirectional first signal route of a first metal layer that is a lowest metal layer above a gate region;
a unidirectional first contact layer below the first signal route that:
has physical contact with the first signal route along a unidirectional first track of the first metal layer with a first distance greater than a width of any signal route in any metal layer orthogonal to the first signal route; and
has no physical contact with the first signal route along the unidirectional first track with a second distance greater than said width;
wherein responsive to a potential being applied to an input node of the integrated circuit, a current is conveyed from the input node to an output node of the integrated circuit through the first contact layer.

16. The computing system as recited in claim 15, wherein the first signal route reaches two boundaries of a standard cell.

17. The computing system as recited in claim 16, wherein the first signal route provides one of a power supply voltage reference level and a ground reference voltage level used by the integrated circuit.

18. The computing system as recited in claim 17, wherein the integrated circuit further comprises:
a unidirectional second signal route of the first metal layer in a unidirectional second track of the first metal layer different than the unidirectional first track of the first metal layer, wherein the second signal route reaches two boundaries of the standard cell; and
a unidirectional second contact layer below and physically connected to the second signal route along the unidirectional second track, wherein the second contact layer reaches two boundaries of a standard cell.

19. The computing system as recited in claim 15, wherein the first distance is greater than a width of a plurality of signal routes of a local interconnect layer below and orthogonal to the first metal layer.

20. The computing system as recited in claim 19, wherein one or more of the plurality of signal routes of the local interconnect layer provide one of an input node and an output node of a standard cell.

* * * * *